United States Patent [19]

Saitoh et al.

[11] Patent Number: 4,865,883
[45] Date of Patent: Sep. 12, 1989

[54] METHOD FOR FORMING A DEPOSITED FILM CONTAINING IN OR SN

[75] Inventors: Keishi Saitoh, Nabari; Masaaki Hirooka, Toride; Jun-ichi Hanna; Isamu Shimizu, both of Yokohama, all of Japan

[73] Assignee: Canon Kabushiki Kaisha, Tokyo, Japan

[21] Appl. No.: 298,202

[22] Filed: Jan. 17, 1989

Related U.S. Application Data

[63] Continuation of Ser. No. 941,424, Dec. 15, 1986, abandoned.

[30] Foreign Application Priority Data

Dec. 17, 1985 [JP] Japan .................. 60-283988

[51] Int. Cl.$^4$ ............................................. C23C 16/40
[52] U.S. Cl. ................. 427/255.3; 427/126.3; 427/162; 427/255
[58] Field of Search ............... 427/255, 255.3, 162, 427/126.3, 126.2, 126.1; 437/225

[56] References Cited

U.S. PATENT DOCUMENTS

| | | | |
|---|---|---|---|
| Re. 31,708 | 10/1984 | Gordon | 427/255.3 |
| 2,552,626 | 5/1951 | Fisher et al. | 201/64 |
| 3,083,550 | 4/1963 | Auerbach | 65/3 |
| 3,188,230 | 6/1965 | Bakish et al. | 117/107.1 |
| 3,203,827 | 8/1965 | Hill | 117/107.2 |
| 3,218,204 | 11/1965 | Ruehrwein | 148/175 |
| 3,224,912 | 12/1965 | Ruehrwein | 148/175 |
| 3,306,768 | 2/1967 | Peterson | 117/108 |
| 3,466,191 | 9/1969 | Stinchfield et al. | 117/213 |
| 3,506,556 | 4/1970 | Gillery et al. | 427/255.3 |
| 3,655,429 | 4/1972 | Deklerk | 117/106 |
| 3,664,866 | 5/1972 | Manasevit | 117/201 |
| 3,850,679 | 11/1974 | Sopko et al. | 117/106 R |
| 3,870,558 | 3/1975 | Shimizu et al. | 117/201 |
| 3,984,587 | 10/1976 | Lipp | 427/70 |
| 4,058,430 | 11/1977 | Suntola et al. | 427/255.2 |
| 4,146,657 | 3/1979 | Gordon | 427/255 |
| 4,180,596 | 12/1979 | Crowder et al. | 427/42 |
| 4,206,252 | 6/1980 | Gordon | 427/255.3 |
| 4,239,811 | 12/1980 | Kemlage | 427/95 |
| 4,328,261 | 5/1982 | Heinecke et al. | 427/91 |
| 4,357,179 | 11/1982 | Adams et al. | 148/1.5 |
| 4,359,490 | 11/1982 | Lehrer | 427/95 |
| 4,402,762 | 9/1983 | John et al. | 148/1.5 |
| 4,416,217 | 11/1983 | Nakamura et al. | 118/696 |
| 4,448,801 | 5/1984 | Fukuda et al. | 427/39 |
| 4,515,107 | 5/1985 | Fournier et al. | 118/718 |
| 4,522,663 | 6/1985 | Ovshinsky et al. | 148/403 |
| 4,526,809 | 7/1985 | Hall et al. | 427/74 |
| 4,529,679 | 7/1985 | Ogawa et al. | 430/84 |
| 4,554,180 | 11/1985 | Hirooka | 427/248.1 |
| 4,595,601 | 6/1986 | Horioka et al. | 427/53.1 |
| 4,615,905 | 10/1986 | Ovshinsky | 427/39 |
| 4,637,938 | 1/1987 | Lee et al. | 427/53.1 |
| 4,650,539 | 3/1987 | Irvine et al. | 156/613 |
| 4,652,463 | 3/1987 | Peter | 427/255.3 |

FOREIGN PATENT DOCUMENTS 2038086  7/1980  United Kingdom.

Primary Examiner—Sadie Childs
Attorney, Agent, or Firm—Fitzpatrick, Cella Harper & Scinto

[57] ABSTRACT

A method for forming a deposited film comprises introducing a gaseous starting material containing In atoms or Sn atoms for formation of a deposited film, a gaseous halogenic oxidizing agent having the property of oxidation action for said starting material and an oxygen-containing gaseous compound into a reaction space to effect chemical contact therebetween to thereby form a plural number of precursors containing a presursor under excited state, and forming a deposited film on a substrate existing in a film forming space with the use of at least one precursor of these precursors as a feeding source for a constituent element of the deposited film.

7 Claims, 1 Drawing Sheet

METHOD FOR FORMING A DEPOSITED FILM CONTAINING IN OR SN

This application is a continuation of application Ser. No. 941,424, filed Dec. 15, 1986, now abandoned.

BACKGROUND OF THE INVENTION

1. Field of the Invention

This invention relates to a method for formation of a functional film, particularly a transparent electrode film which is useful for electronic devices such as semiconductor device, photosensitive devices for electrophotography, optical input sensor devices for optical image inputting devices, etc.

2. Related Background Art

In the prior art, for transparent electrode films, suitable film forming methods have been individually employed from the standpoint of desired physical characteristics, uses, etc.

For example, transparent electrodes have been formed by the vacuum vapor deposition method or the sputtering method by use of an electron beam.

In the prior art, in a solar battery using an A-Si:H film, the production process is continuously performed to form the A-Si:H film. Then, new by using an electron beam vapor deposition vessel or a sputtering device, transparent electrodes are formed on the A-Si:H film.

Since the A-Si:H film formed in vacuum is left to stand in the air before formation of transparent electrodes, the surface of the A-Si:H film may sometimes oxidize to lessen the contact with the transparent electrodes, whereby lowering in convergence efficiency of the solar battery result. Also, since dust is liable to be sticked onto the surface of A-Si:H film, there occurs the problem that the series resistance is increased.

SUMMARY OF THE INVENTION

An object of the present invention is to remove the drawbacks of the method for forming deposited films as described above and at the same time to provide a novel method for forming a deposited film without use of the formation method of the prior art.

Another object of the present invention is to attempt to effect conservation of energy and at the same time to provide a method for forming a deposited film capable of obtaining a deposited film with uniform characteristics over a large area with easy management of film quality.

Still another object of the present invention is to provide a method for forming a deposited film by which a film excellent in productivity and bulk productivity, having high quality as well as excellent physical characteristics such as electrical, optical and semiconductor characteristics can be easily obtained.

According to the present invention, there is provided a method for forming a deposited film which comprises introducing a gaseous starting material containing In atoms or Sn atoms for formation of a deposited film, a gaseous halogenic oxidizing agent having the property of oxidation action for said starting material and an oxygen-containing gaseous compound into a reaction space to effect chemical contact therebetween to thereby form a plural number of precursors containing a precursor under excited state, and forming a deposited film on a substrate existing in a film forming space with the use of at least one precursor of these precursors as a feeding source for a constituent element of the deposited film.

According to the method for forming a deposited film of the present invention, simplification of management and bulk production can be effected with full satisfaction of enlargement of area, uniformity of film thickness and uniformity of film quality, simultaneously with conservation of energy, without requiring enormous installation investment for bulk production apparatus, and also the parameters for bulk production become clear to afford broad latitude in management tolerance and simple control of the device. For example, in a device for forming an A-Si:H solar battery comprising a plural number of film forming devices, by connecting another film forming device according to the present invention thereto, continuous formation is possible to form transparent electrodes without breaking the vacuum.

DESCRIPTION OF THE PREFERRED EMBODIMENT

Figure 1:
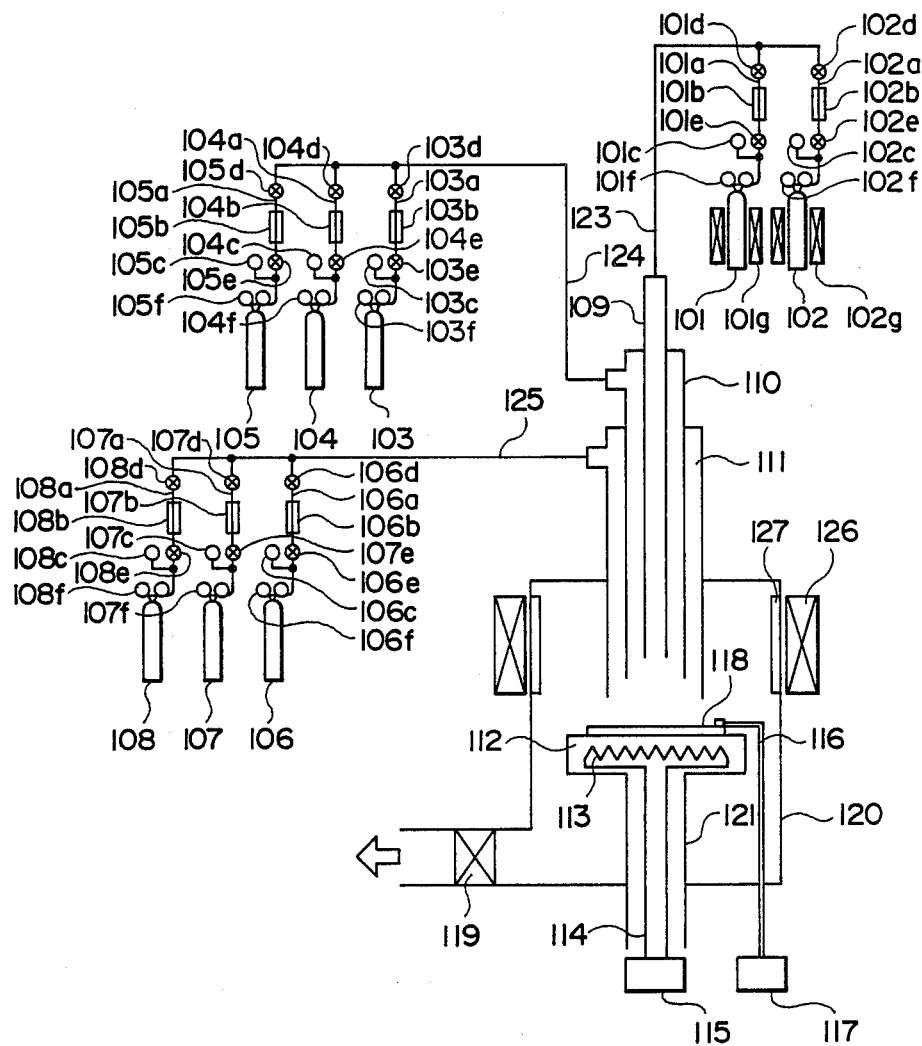
FIG. 1 is a schematic illustration of a film forming device used in the Examples of the present invention.

In the method for forming a deposited film of the present invention, the starting material for formation of a deposited film oxidizing through chemical contact with a gaseous halogenating oxidizing agent and can be selected suitably as desired depending on the kind, characteristic, use, etc., of the desired deposited film. In the present invention, the above gaseous starting material and the gaseous halogenic oxidizing agent may be those which can be made gaseous when contacted with each other, and they can be either liquid or solid in their ordinary state.

When the starting material for formation of a deposited film or a halogenic oxidizing agent is liquid or solid, the starting material for formation of a deposited film and the halogenic oxidizing agent are introduced in gaseous state into the reaction space while performing bubbling with the use of a carrier gas such as Ar, He, $N_2$, $H_2$, etc., optionally with application of heat.

During this operation, the partial pressures and mixing ratio of the above gaseous starting material and the gaseous halogenic oxidizing agent may be set by controlling the flow rate of the carrier gas or the vapor pressures of the starting material for formation of the deposited film and the gaseous halogenic oxidizing agent.

As the starting material for formation of a deposited film to be used in the present invention, for example, as the In type starting material, there may be included organic In compounds such as $In(CH_3)_3$, $In(C_2H_5)_3$, $In(C_3H_7)_3$, $In(C_4H_9)_3$, etc. as useful starting materials. On the other hand, as the Sn type starting material, there may be included hydrogenated and organic Sn compounds such as $SnH_4$, $Sn(CH_3)_4$, $Sn(C_2H_5)_2$, $Sn(C_2H_5)_4$, $Sn(n\text{-}C_4H_9)_4$, $SnH(n\text{-}C_4H_9)_3$, $SnCl(n\text{-}C_4H_9)_3[Sn(C_2H_5)_3]_2$ etc. as useful starting materials.

Further, examples of the oxygen-containing gaseous compound may include $O_2$, $NO$, $N_2O$, $NO_2$, $CO$, $CO_2$, $H_2O$, etc. as useful ones.

Of course, these starting materials may be used not only singularly, but also as in mixture of two or more kinds.

The halogenic oxidizing agent to be used in the present invention is gaseous when introduced into the reaction space and at the same time has the property of effectively oxidizing the gaseous starting material for formation of a deposited film introduced into the reaction space by mere chemical contact therewith, including halogen gases such as $F_2$, $Cl_2$, $Br_2$, $I_2$, etc., and fluorine, chlorine, bromine, etc., under nascent state as effective ones.

These halogenic oxidizing agents are introduced into the reaction space under gaseous state together with the gas of the starting material for formation of a deposited film, as described above, with desired flow rate and feeding pressure being given, wherein they are mix with and collide against the above starting materials to be contacted therewith, thereby oxidizing the above starting material to generate efficiently a plurality of precursors including a precursor under excited state. Of the precursors under excited state and other precursors generated, at least one of them function as a feeding source for a constituent element of the deposited film to be formed.

The precursors generated may undergo decomposition or reaction to be converted to other precursors under excited state or to precursors under another excited state, or alternatively stand in their original forms although releasing energy, if necessary, to contact the substrate surface arranged in a film forming space, whereby a deposited film with a three-dimensional network structure is prepared.

In the present invention, so that the deposit film forming process may proceed smoothly to form a film of high quality and having desired physical characteristics, as the film forming factors, the kinds and combination of the starting material and the halogenic oxidizing agent, the mixing ratio, pressure during mixing and flow rate thereof, the inner pressure of the film forming space, the flow types of the gases, and the film forming temperature (substrate temperature and atmospheric temperature) are suitably selected as desired. These film forming factors are interrelated, and they are not determined individually but determined respectively according to the mutual relationships. In the present invention, the ratio of the gaseous starting material for formation of a deposited film and the gaseous halogenic oxidizing agent to be introduced into the reaction space may be determined suitably as desired in relationship of film forming factors as mentioned above, but it is preferably 1/20 to 100/1, more preferably 1/5-50/1 in terms of flow rate ratio introduced.

The mixing ratio of the oxygen-containing compound to the gaseous starting material should desirably be 1/10 to 10/1.

The pressure during mixing when introduced into the reaction space may be preferably higher in order to enhance the probability of chemical contact between the above gaseous starting materials and the above gaseous halogenic oxidizing agent, but it is better to determine the optimum value suitably as desired in view of the reactivity. Although the pressure during mixing may be determined as described above, each of the pressures during introduction may be preferably $1 \times 10^{-7}$ atm to 10 atm, more preferably $1 \times 10^{-6}$ atm to 3 atm.

The pressure within the film forming space, namely the pressure in the space in which the substrate for effecting film formation therein is arranged, may be set suitably as desired so that precursors (E) under excited state generated in the reaction space and sometimes precursors (D) formed as secondary products from said precursors (E) may contribute effectively to film formation.

The inner pressure of the film forming space, when the film forming space is continuous and open to the reaction space, can be controlled in relation with the introduction pressures and flow rates of the gaseous starting material for formation of a deposited film and the gaseous halogenic oxidizing agent in the reaction space, for example, by application of a contrivance such as differential evacuation or use of a large scale evacuating device.

Alternatively, when the conductance at the connecting portion between the reaction space and the film forming space is small, the pressure in the film forming space can be controlled by providing an appropriate evacuating device in the film forming space and controlling the evacuation rate of said device.

On the other hand, when the reaction space and the film forming space are integral and the reaction position and the film forming position are only different in space, it is possible to effect differential evacuation or provide a large scale evacuating device having sufficient evacuating capacity as described above.

As described above, the pressure in the film forming space may be determined in relation with the introduction pressures of the gaseous starting material and the gaseous halogenic oxidizing agent introduced into the reaction space, but it is preferably 0.001 Torr to 100 Torr, more preferably 0.01 Torr to 30 Torr, optimally 0.05 to 10 Torr.

As for the flow type of the gases, it is necessary to design the flow type in view of the geometric arrangement of the gas introducing inlet, the substrate and the gas evacuating outlet so that the starting material for formation of a deposited film and the halogenic oxidizing agent may be uniformly and efficiently mixed during introduction of these into the reaction space, the above precursors (E) may be efficiently generated and film formation may be adequately performed without trouble. A preferable example of the geometric arrangement is shown in FIG. 1.

As the substrate temperature (Ts) during film formation, it can be set suitably as desired individually depending on the gas species to be employed and the kinds and required characteristics of the deposited film to be formed, but, in the case of obtaining an amorphous film, it is preferably from room temperature to 500° C., more preferably from 50 to 400° C.

As the atmosphere temperature (Tat) in the film forming space, it may be determined suitably as desired in relation with the substrate temperature so that the above precursors (E) and the above precursors (D) generated are not changed to unsuitable chemical species for film formation, and also the above precursors (E) may be efficiently generated.

The substrate to be used in the present invention may be either electroconductive or electrically insulating, provided that it is selected as desired depending on the use of the deposited film to be formed. As the electroconductive substrate, there may be mentioned metals such as NiCr, stainless steel, Al, Cr, Mo, Au, Ir, Nb, Ta, V, Ti, Pt, Pd, etc. or alloys thereof.

As insulating substrates, there may conventionally be used films or sheets of synthetic resins such as polyesters, polyethylene, polycarbonates, cellulose acetate, polypropylene, polyvinyl chloride, polyvinylidene chloride, polystyrene, polyamides, etc., glass, ceramics, paper and so on. These insulating substrates may be subjected to electroconductive treatment.

For example, electroconductive treatment of a glass substrate can be effected by providing a thin film of NiCr, Al, Cr, Mo, Au, Ir, Nb, Ta, V, Ti, Pt, Pd, $In_2O_3$, $SnO_2$, ITO ($In_2O_3+SnO_2$), etc., thereon Alternatively, a synthetic resin film such as polyester film can be subjected to electroconductive treatment on its surface by vacuum vapor deposition, electron-beam deposition or sputtering of a metal such as NiCr, Al, Ag, Pb, Zn, Ni, Au, Cr, Mo, Ir, Nb, Ta, V, Ti, Pt, etc., or by laminating treatment with said metal, thereby imparting electroconductivity to the surface.

The substrate may be shaped in any form such as cylinders, belts, plates or others, and its form may be determined as desired.

The substrate should be preferably selected from among those set forth above in view of adhesion and reactivity between the substrate and the film. Further, if the difference in thermal expansion between both is great, a large amount of strain may be created within the film to give sometimes a film of poor quality, and therefore it is preferable to use a substrate so that the difference in thermal expansion is small.

Also, the surface state of the substrate is directly related to the structure of the film (orientation) or generation of a stylet structure, and therefore it is desirable to treat the surface of the substrate to give a film structure and a film texture so that desired characteristics may be obtained.

FIG. 1 shows an example of a preferable device for practicing the method for forming a deposited film of the present invention.

The deposited film forming device shown in FIG. 1 is broadly classified in three section a main device, an evacuation system and a gas feeding system.

In the main device, a reaction space and a film forming space are provided.

101–108 are respectively bombs filled with gases to be used during film formation, 101a–108a are respectively gas feeding pipes, 101b–108b are respectively mass flow controllers for controlling the flow rates of the gases from the respective bombs, 101c–108c are respectively gas pressure gauges, 101d–108d and 101e–108e are respectively valves, and 101f–108f are respectively pressure gauges indicating the pressures in the corresponding gas bombs.

120 is a vacuum chamber equipped at the upper portion with a pipeline for gas introduction, having a structure for formation of the reaction space downstream of the pipeline, and also having a structure for formation of a film forming space in which a substrate holder 112 is provided so that a substrate 118 may be arranged opposite to the gas discharging outlet of said pipeline. The pipeline for gas introduction has a triple concentric arrangement structure, having from the innerside a first gas introducing pipe 109 for introducing the gases from the gas bombs 101, 102, a second gas introducing pipe 110 for introducing the gases from the gas bombs 103–105 and a third gas introducing pipe 111 for introducing the gases from the gas bombs 106–108.

For gas introduction to the reaction space through each gas introducing pipe, the discharging portion of the pipe is designed so as to be arranged at a position farther from the surface position of the substrate as the pipe is nearer to the inner side. In other words, the gas introducing pipes are arranged so that the pipe on the outer side may enclose the pipe existing within the innerside thereof.

The gases from the respective bombs are fed into the respective introducing pipes through the gas feeding pipelines 123–125, respectively.

The respective gas introducing pipes, the respective gas feeding pipelines and the vacuum chamber 120 are evacuated to vacuum through the main vacuum valve 119 by means of a evacuating device not shown.

The substrate 118 is set at a suitably desired distance from the positions of the respective gas introducing pipes by moving vertically the substrate holder 112.

In the case of the present invention, the distance between the substrate and the gas discharging outlet of the gas introducing pipe may be determined appropriately in view of the kinds and desired characteristics of the deposited film formed, the gas flow rates, the inner pressure of the vacuum chamber, etc., but it is preferably several mm to 20 cm, more preferably 5 mm to about 15 cm.

113 is a heater for heating the substrate which is provided in order to heat the substrate to an appropriate temperature during film formation, or preheating the substrate 118 before film formation, or further to anneal the film after film formation.

The substrate heating heater 113 is supplied with power through a conductive wire 114 from a power source 115.

116 is a thermocouple for measuring the temperature of the substrate (Ts) and is electrically connected to the temperature display device 117.

The present invention is described in more detail by referring to the following Examples.

EXAMPLE 1

By use of the film forming device shown in FIG. 1, a deposited film was prepared according to the conditions shown in Table 1.

$In(CH_3)_3$ filled in the bomb 101 is heated to 140° C. by the heater 101 g to gasify $In(CH_3)_3$, and the resultant gas was introduced at 5 sccm through the gas introducing pipe 109 into the vacuum chamber 120. Also, $Sn(CH_3)_4$ filled in the bomb 102 was heated by the heater 102g to gasify it, and the resultant gas was introduced at 5 sccm through the gas introducing pipe 109 into the vacuum chamber 120. Further, $F_2$ gas filled in the bomb 106 at 1 sccm, He gas filled in the bomb 107 at 10 sccm through the gas introducing pipe 111 and NO gas filled in the bomb 104 at 10 sccm through the gas introducing pipe 110 were introduced into the vacuum chamber 120.

During this operation, the pressure in the vacuum chamber 120 was made 800 m Torr by controlling the opening of the vacuum valve 119. A quartz glass substrate (15 cm × 15 cm) was used, and the distance between the gas introducing port 111 and the substrate was set at 3 cm. The substrate temperature (Ts) was set at 100° C. as shown in Table 1 for each sample.

Under this state, a transparent electrode with the thickness shown in Table 1 was deposited on the substrate.

The distribution irregularity of the film thickness was within ±5%.

The characteristics of the film obtained had the values as shown for Example 1 in Table 1.

EXAMPLE 2

By use of the film forming device shown in FIG. 1, a deposited film was formed under the conditions for Example 2 in Table 1.

The operational procedure of the film forming device was the same as in Example 1. The results shown for Example 2 in Table 1 were obtained.

EXAMPLE 3

By use of the film forming device shown in FIG. 1, a deposited film was formed under the conditions for Example 3 in Table 1.

The operational procedure of the film forming device was the same as in Example 1. The results shown for Example 3 in Table 1 were obtained.

TABLE I

| Example | Starting material gas | Flow rate (sccm) | Inner pressure (Torr) | Substrate temperature (°C.) | Deposition speed (Å/s) | Film thickness (μm) | Resistivity value (Ωcm) |
|---|---|---|---|---|---|---|---|
| 1 | $F_2$ | 1 | 0.8 | 100 | 0.17 | 0.1 | $10^{-1}$ |
|   | He | 10 |  |  |  |  |  |
|   | $In(CH_3)_3$ | 5 |  |  |  |  |  |
|   | $Sn(CH_3)_4$ | 5 |  |  |  |  |  |
|   | NO | 10 |  |  |  |  |  |
| 2 | $F_2$ | 3 | 0.8 | 100 | 0.2 | 0.1 | $2 \times 10^{-1}$ |
|   | He | 10 |  |  |  |  |  |
|   | $Sn(CH_3)_4$ | 5 |  |  |  |  |  |
|   | NO | 5 |  |  |  |  |  |
| 3 | $F_2$ | 2 | 0.8 | 300 | 0.18 | 0.1 | $10^{-2}$ |
|   | He | 10 |  |  |  |  |  |
|   | $In(CH_3)_3$ | 7 |  |  |  |  |  |
|   | $Sn(CH_3)_4$ | 7 |  |  |  |  |  |
|   | NO | 10 |  |  |  |  |  |

As can be seen from the detailed description and the respective examples as set forth above, according to the deposition film forming method of the present invention, deposited films having uniform physical properties over a large area can be obtained with easy management of film quality at the same time as achievement of energy saving. Also, it is possible to obtain easily films excellent in productivity and bulk productivity and having high quality with excellent physical properties such as electrical, optical and semiconductor properties, etc.

What we claim is:

1. A method for forming a deposited film, comprising:

introducing into a reaction space (a) a gaseous starting material containing In atoms or Sn atoms for formation of a deposited film, (b) a gaseous halogenic oxidizing agent capable of oxidizing said starting material, and selected from the group consisting of $F_2$, $Cl_2$, $Br_2$ and $I_2$, and (c) an oxygen-containing gaseous compound, thereby forming a mixture and effecting chemical contact therebetween to form a plurality of precursors including a precursor in an excited state; and forming a deposited film on a substrate in a film forming space through a gas introducing conduit system without the use of external discharge energy in the film forming space with at least one of said precursors as a feed source for the constituent element of said deposited film, said gas introducing conduit system including a plurality of coaxially aligned conduits each having an exit orifice with an outer conduit adapted to carry said gaseous halogenic oxidizing agent and at least one inner conduit adapted to carry said gaseous starting material, said coaxially aligned conduits extending into the film forming space such that the exit orifice of the inner conduit is set back from the exit orifice of the outer conduit to enable the gaseous halogenic oxidizing agent in the outer conduit to surround the gaseous starting material exiting said inner conduit, said substrate positioned from 5 millimeters to 15 centimeters from the exit orifice of said outer conduit.

2. A method for forming a deposited film according to claim 1, wherein said gaseous starting material is an organic In compound.

3. A method for forming a deposited film according to claim 1, wherein said gaseous starting material is an organic Sn compound.

4. A method for forming a deposited film according to claim 1, wherein said gaseous halogenic oxidizing agent is fluorine gas.

5. A method for forming a deposited film according to claim 1, wherein said gaseous halogenic oxidizing agent is chlorine gas.

6. A method for forming a deposited film according to claim 1, wherein said gaseous halogenic oxidizing agent is under nascent state.

7. A method for forming a deposited film according to claim 1, wherein said substrate is arranged at a position opposed to the direction in which said gaseous starting material and said gaseous halogenic oxidizing agent are introduced into said reaction space.

* * * * *

UNITED STATES PATENT AND TRADEMARK OFFICE
CERTIFICATE OF CORRECTION

PATENT NO.  : 4,865,883
DATED       : September 12, 1989
INVENTOR(S) : KEISHI SAITOH, ET AL.

It is certified that error appears in the above-identified patent and that said Letters Patent is hereby corrected as shown below:

Title page:

IN [56] REFERENCES CITED

U.S. PATENT DOCUMENTS, "Peter" should read --Peters--.

Attorney, Agent, or Firm, "Fitzpatrick, Cella Harper & Scinto" should read --Fitzpatrick, Cella, Harper & Scinto--.

COLUMN 1

Line 13, "device," should read --devices,--.
    Line 26, "new" should be deleted.
    Line 34, "result." should read --results.-- and "be" should be deleted.
    Line 35, "sticked onto" should read --stick to-- and "of A-Si:H film," should read --of an A-Si:H film,--.

COLUMN 2

Line 28, "oxidizing" should read --is oxidized--.

COLUMN 3

Line 12, "are" should be deleted.
    Line 18, "function" should read --functions--.
    Line 45, "of" should read --to the related--.

UNITED STATES PATENT AND TRADEMARK OFFICE
CERTIFICATE OF CORRECTION

PATENT NO. : 4,865,883

DATED : September 12, 1989

INVENTOR(S) : KEISHI SAITOH, ET AL.

It is certified that error appears in the above-identified patent and that said Letters Patent is hereby corrected as shown below:

COLUMN 5

Line 6, "thereon Alternatively," should read
--thereon. Alternatively,--.

Line 35, "section a" should read --sections: a--.

COLUMN 6

Line 58, "gas introducing port 111" should read
--gas introducing pipe 111--.

Signed and Sealed this

Twenty-ninth Day of September, 1992

Attest:

DOUGLAS B. COMER

Attesting Officer    Acting Commissioner of Patents and Trademarks